(12) United States Patent
Wilczynski (10) Patent No.: US 6,342,967 B1
(45) Date of Patent: Jan. 29, 2002

(54) PHOTOLITHOGRAPHY LENS (76) Inventor: Janusz S. Wilczynski, 11 Rue du Soleil, Sandia Park, NM (US) 87047-9337

( * ) Notice: Subject to any disclaimer, the term of this patent is extended or adjusted under 35 U.S.C. 154(b) by 0 days.

(21) Appl. No.: 09/534,952

(22) Filed: Mar. 24, 2000

Related U.S. Application Data (60) Provisional application No. 60/184,868, filed on Feb. 25, 2000.

(51) Int. Cl.[7] .......................... G02B 17/00; G02B 21/00; G02B 23/00
(52) U.S. Cl. .......................... 359/364; 359/727; 359/857
(58) Field of Search ................................ 359/364, 365, 359/726, 727, 730, 857, 858, 861

(56) References Cited

U.S. PATENT DOCUMENTS

| | | | | |
|---|---|---|---|---|
| 4,395,095 A | * | 7/1983 | Horton | 359/365 |
| 5,241,423 A | * | 8/1993 | Chiu et al. | 359/727 |
| 5,287,218 A | * | 2/1994 | Chen | 359/365 |
| 5,592,329 A | * | 1/1997 | Ishiyama et al. | 359/399 |
| 5,668,673 A | * | 9/1997 | Suenaga et al. | 359/731 |

OTHER PUBLICATIONS

D. D. Maksutov, Astronomiczeskaya Optika, Publisher OGIZ (Leningrad), 296–297, (1945).

Handbook of Optics, vol. 11 McGraw Hill, New York (Michael Bass, Ed) p. 18.12.

* cited by examiner

Primary Examiner—Mark A. Robinson
(74) Attorney, Agent, or Firm—Rodney T. Hodgson (57) ABSTRACT

A lens design having two concave mirrors or Mangins and a turning mirror is disclosed. The optical axis of the concave elements are coplanar and intersect on a turning mirror, and the normal to the surface of the turning mirror bisects the angle between the two optical axis.

16 Claims, 8 Drawing Sheets

PHOTOLITHOGRAPHY LENS

CROSS REFERENCE TO RELATED APPLICATIONS

This application claims priority from U.S. Provisional application Ser. No. 60/184,868, filed Feb. 25, 2000.

FIELD OF THE INVENTION

The field of the invention is the field of optical lenses, and in particular optical lenses for use in photolithography in the semiconductor industry.

BACKGROUND OF THE INVENTION

Advances in computers have largely been driven by advances in photolithography, where better lenses and shorter wavelength light allow exposure of ever finer features. In large part, the lens design process is also driven by the advances in computers, as it becomes ever faster to trace rays and numerically optimize lens design. A great deal of scope for the experienced and talented lens designer still remains, however, as the computer does not yet "know" which of the interrelated variables to optimize first, nor which variable is less or more sensitive to variations in manufacture or adjustment.

In particular, as the photolithographic wavelength shrinks from around 250 nanometers (nm) to 190 nm and to 157 nm to take advantage of available laser sources of light, the number of adjustable parameters available to lens designers shrinks even faster. In the visible and near ultraviolet region, there are a multitude of glasses which have the required homogeneity and transparency and which can provide a range of index of refraction and dispersion coefficients needed for production high numerical aperture (N. A.) diffraction limited lenses. Fused silica, the material of choice for lenses, starts to absorb at 160.5 nm, and at 157 nm the absorption in the lens material would preclude use. The only practical material for the construction of refractive lenses for the shorter wavelengths is a fluorite material, and in particular calcium fluoride.

Refractive lenses limited to only one material need a very large number of elements, (above 35 in some cases for flat field lenses having a large image size and high N. A.), and need a very large diameter. The cost of such lenses increases at least as the 3.8 power of the diameter, and the material cost and the fabrication costs become prohibitive for lenses with many elements and large dimensions.

Such lenses are now widely used in photographic and projecting equipment, television cameras, microscopy, and as of late, manufacturing equipment in the semiconductor industry. Here, anastigmatic lenses are used in step-and-repeat or scanning cameras for patterning microprocessors, memory and logic chips, etc. These optical systems can be divided into two classes. The most common class is the extension of the double Gauss lens due to Glatzel (Zeiss Company) reported at the International Lens Design Conference, Mills College, Calif. in 1981, and published by SPIE and OSA. The Glatzel lens exhibits a "double bulge". In the Glatzel designs, the field curvature is corrected by two or more shrinks and expansions of the bundle of rays passing through the lens. This compares with just a single shrink in the conventional photographic lens, such as a triplet or a double Gauss lens. Such lenses are extremely expensive because many more lens elements are used. The other class of lenses used are the "ring systems", where the optics is corrected along an annulus and no effort is made to correct the field curvature. Ring system lenses are inefficient in their use of the light.

Reflective lens elements are inherently achromatic, and may be used at the shortest wavelengths. However, the aberrations introduced by reflection from curved surfaces at non normal incidence have convinced many designers skilled in the art that such mirrors can not give diffraction limited performance at high numerical apertures in an axially symmetric system.

One telescope designer, D. D. Maksutov, published a design of an aplanatic telescope in a book called ASTRO-NOMICZESKAYA OPTIKA, published by OGIZ (Leningrad) in 1945, using two curved mirrors. This design is a version of the Gregory telescope where the secondary mirror is also concave, and is positioned beyond the focal point of the primary mirror. By definition, an aplanatic telescope must have a correction for spherical aberration and coma. The two simultaneous quadratic equations which must be solved have real roots only for a rather large central obstruction and a real image plane in front of the primary mirror. The telescope as designed left all aberrations and their higher order residuals uncorrected except for Seidel type spherical aberrations and coma, and there is no way of correcting them further.

Useful references for Lens Design are: A. E. Conrady, Applied Optics and Optical Designs, $2^{nd}$ Edition, Dover Publications, in 2 volumes 1957 and 1960; H. H. Hopkins, Wave Theory of Aberrations, Oxford University Clarendon Press, 1950; and R. R. Shannon, The Art and Science of Lens Design, Cambridge University Press, 1997.

The above identified references, patent applications, and provisional patent applications are hereby incorporated in their entirety herein by reference.

The present invention shows the way to use combinations of refractive and reflective lens elements to produce the required lens designs.

OBJECTS OF THE INVENTION

It is an object of the invention to produce a diffraction limited optical lens having a high numerical aperture for wavelengths where the number of optical materials for refractive lens elements is small. It is a further object of the invention to produce a diffraction limited optical lens having a high numerical aperture having fewer lens elements at less cost than a refractive lens having equivalent parameters. It is a further object of the invention to produce a diffraction limited optical lens having a high numerical aperture which includes refractive elements and reflective elements with curved reflective surfaces. It is a further object of the invention to produce a diffraction limited optical lens having a high numerical aperture having two reflective elements, each of which receives light from an object plane symmetrically with respect to an optical axis normal to the reflective surface.

SUMMARY OF THE INVENTION

The present invention is a system, apparatus and method to use two focusing mirrors in a high numerical aperture lens design. The optical axis of each mirror are coplanar and intersect at the position of a turning mirror having a normal to the surface of the turning mirror which bisects the angle formed by the two optical axis.

DETAILED DESCRIPTION OF THE INVENTION

The present invention consists of a novel flat field anastigmat. In addition to having an excellent correction it has a fewer number of elements as compared to the conventional refracting lens. The reduction in the number of elements is fundamentally due to the way in which the field curvature is corrected.

As is well known in the field of geometrical optics, a reflecting surface has a refractive index of −1. All optical materials in the visible and ultraviolet range have a positive refractive index. Since the field curvature depends only on the power of the lenses, which are taken to be infinitely thin for this purpose and refractive index, it appears that a suitable combination of lenses and mirrors should render a solution suitable for a vast number of applications.

Figure 1:
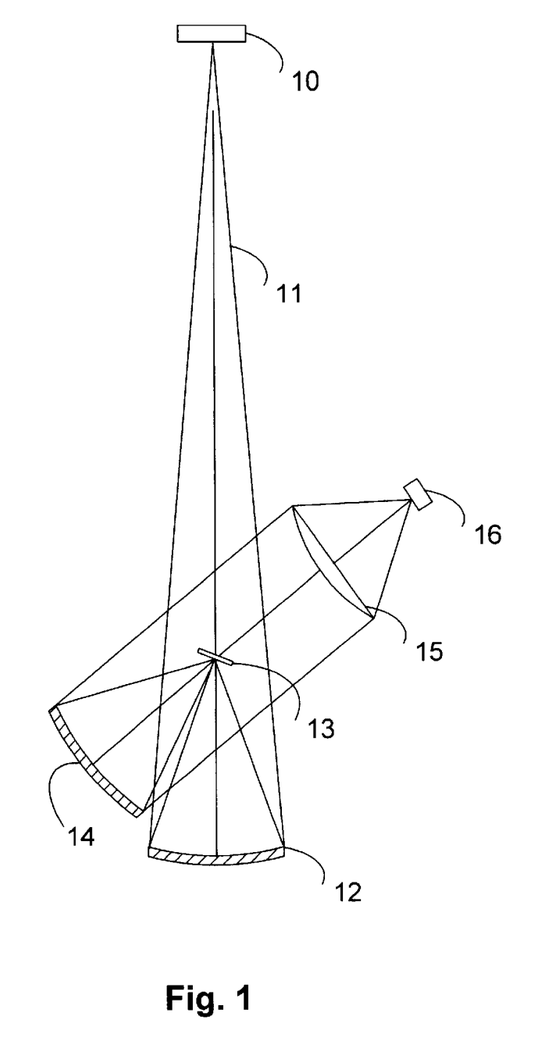
FIG. 1. Optical layout of the most preferred embodiment of the invention.

FIG. 1 shows an optical diagram of the present invention. Light rays 11 are shown arising from the center of an object 10 proceeding to a focusing mirror 12. Light rays arising from the object 10 form a diverging beam towards the mirror 12. The light rays 11 are shown reflected from mirror 12 and being focused on to a turning mirror 13. The rays reflected from the turning mirror 13 diverge to a second mirror 14, and are reflected as a beam to a lens 15, where they are focused on to an image receiver 16. The optical axis (here defined as an line through the center of an optical element which is normal to the surface of the optical element at the intersection point) of the focusing mirrors 12 and 14 are coplanar in the most preferred embodiment of the invention, but might be slightly offset in some embodiments. The normal to the surface of the turning mirror 13 bisects the angle between the optical axis of mirror 12 and the optical axis of mirror 14. In the embodiment shown in FIG. 1, the optical axis of mirror 12 intersects the surface of the object 10 normally in the center of the object surface. The optical axis of the mirror 14 normally intersects the center of the image receiver 16.

Figure 2:
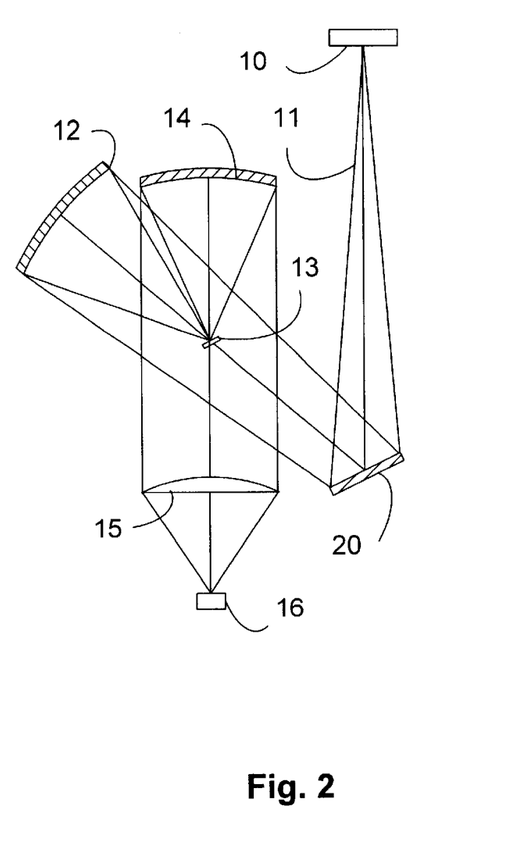
FIG. 2. Optical layout of a preferred embodiment of the invention.

FIG. 2 shows that, with the addition of a single turning mirror 20, the design of FIG. 1 may be modified so that the surface of the object and the surface of the image of the object are parallel, which would be required by practical considerations in a photolithographic stepper system.

Figure 3:
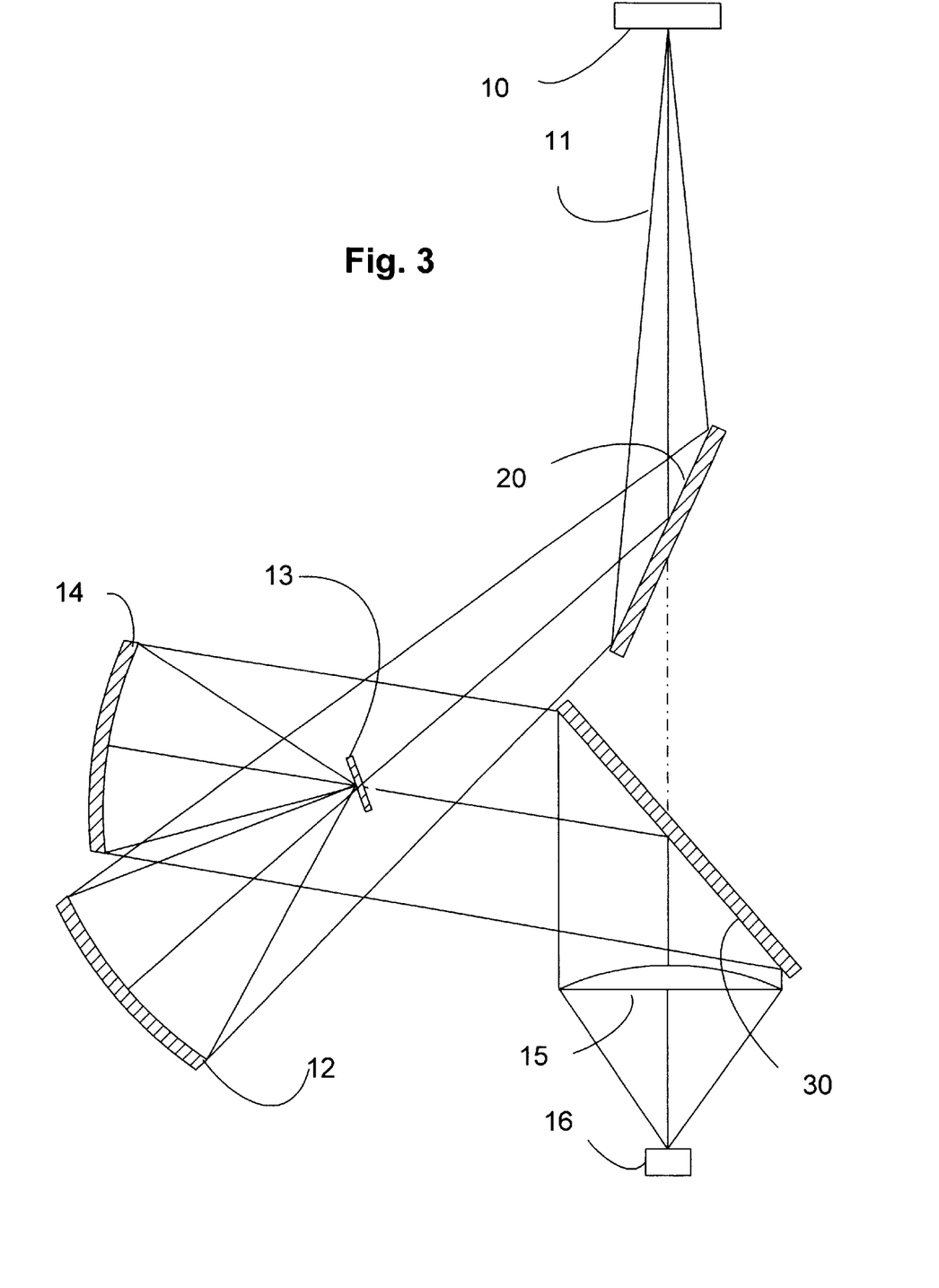
FIG. 3. Optical layout of a preferred embodiment of the invention.

FIG. 3 shows that, with the addition of two turning mirrors 20 and 30, the design of FIG. 1 may be modified so that the normal to the object surface in the center of the object and the normal to the image surface in the center of the image. An existing "straight through" refractive lens could be removed and replaced with the lens of the invention, or, more importantly, an existing lithographic stepper design would not have to be substantially modified to use the lens of the invention.

Figure 4:
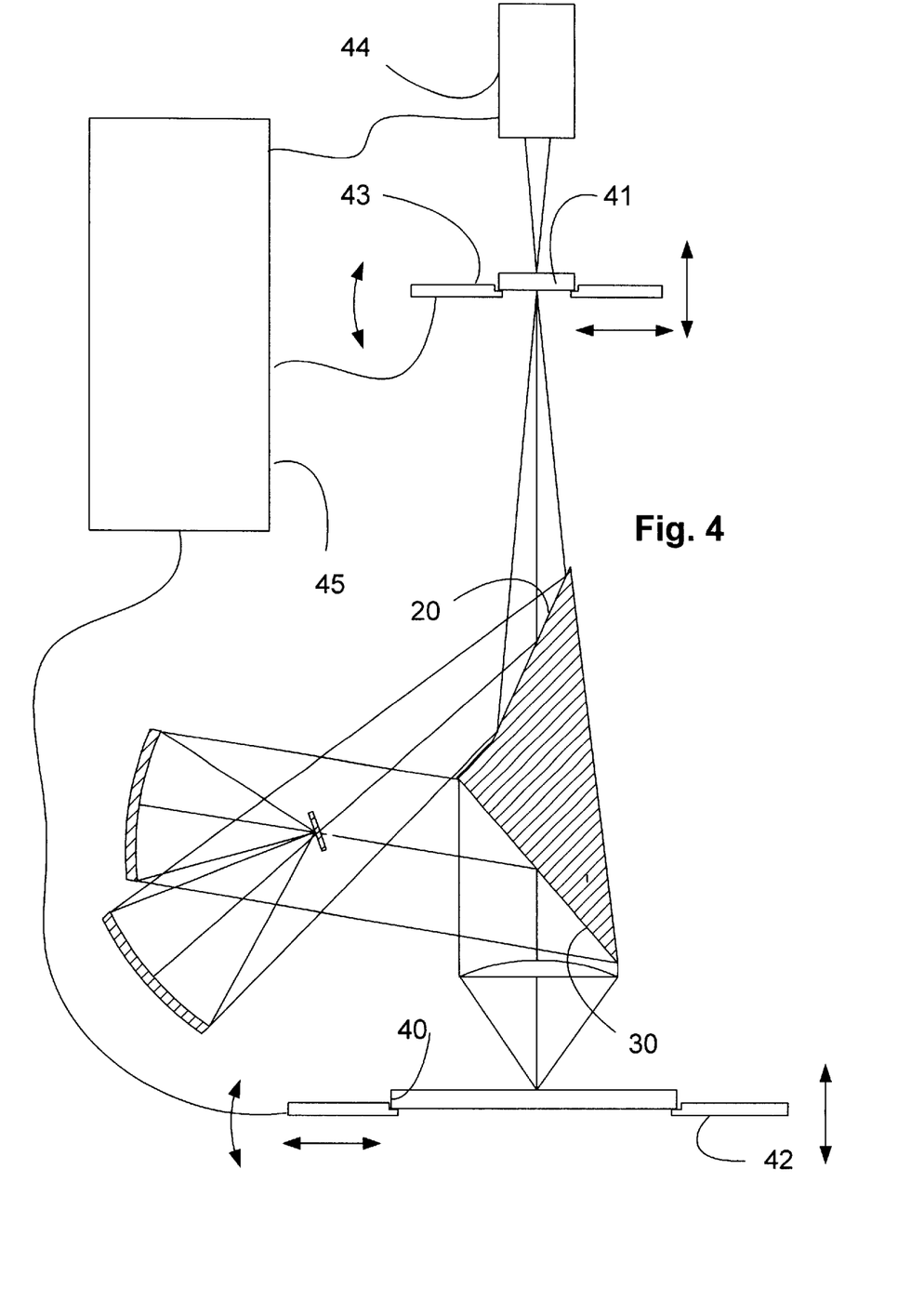
FIG. 4. Schematic diagram of a system using an embodiment of the invention.

FIG. 4 shows an example of a lithographic system for exposing photoresist covered wafer 40 with light transmitted through a mask 41. The wafer is held by an adjustable wafer holder 42, and the mask is held by an adjustable mask holder 43. The wafer and mask may be adjusted with respect to each other and with respect to the lens of the invention by means well known in the art. A light source 44 is shown illuminating the mask 41. Light may be transmitted through the mask, as shown, or may be reflected from the mask. A computer is 45 shown for controlling the light source and the adjustments of the mask and wafer holders.

Figure 5:
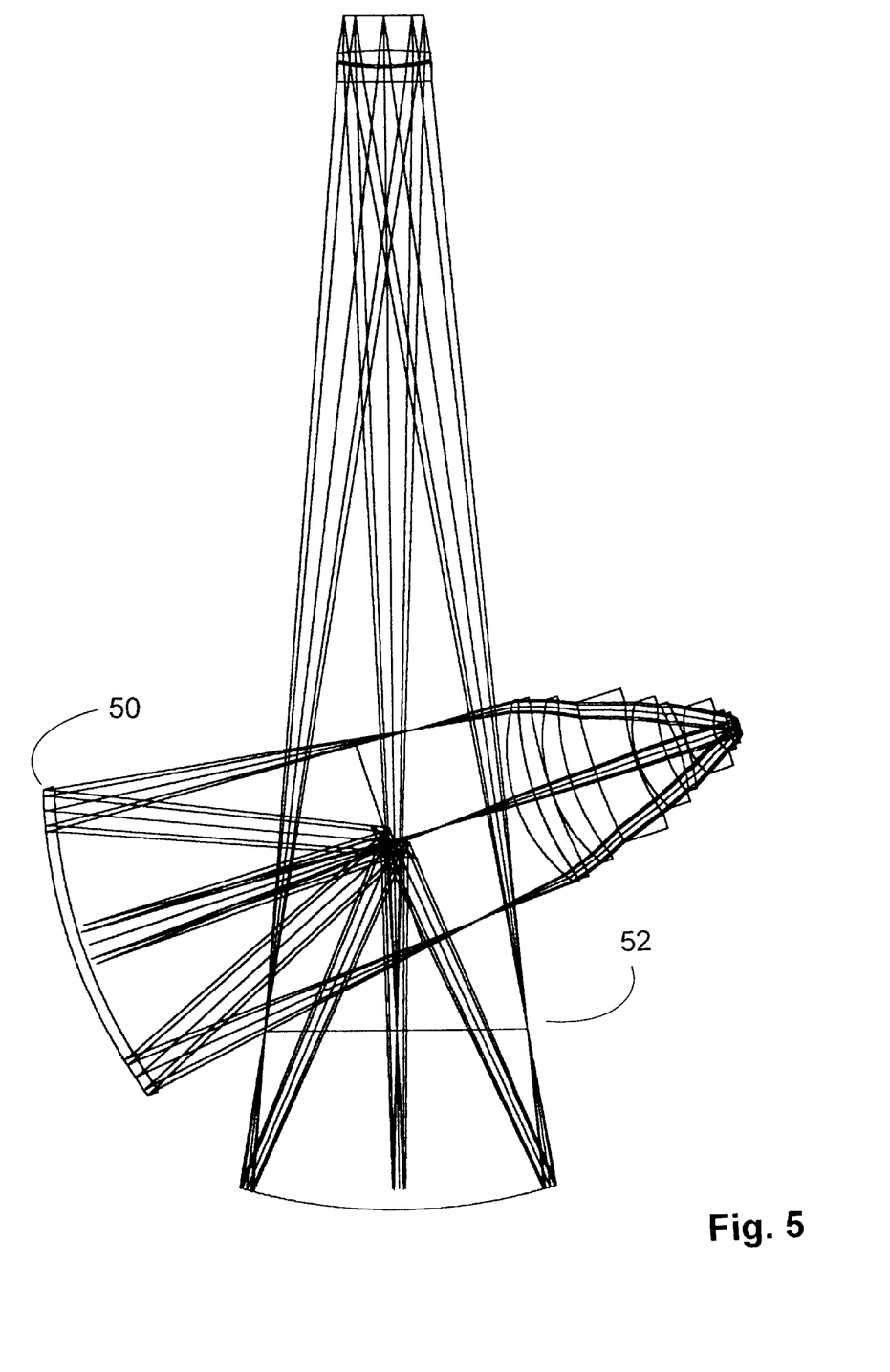
FIG. 5. Example of a partially optimized lens design of the apparatus of the invention.

FIG. 5 shows an example of a partially optimized lens design of the apparatus of the invention. In FIG. 5, one of the focusing reflecting elements 50 is a Mangin, which is a transparent lens element which is coated on one side with a reflecting material. A Mangin gives much better protection to the reflective coating than the normal first surface reflective coating of an optical element. Each refractive optical element shown in FIG. 5 would normally have surfaces covered with a multilayer coating so that the reflectivity from the surface of the transparent refractive material is greatly reduced. The position 52 of an aperture stop is noted.

The particular design depicted in FIG. 5 has a Numerical Aperture (NA) of 0.690 and an input NA of 0.138 giving a reduction of 5×. The lens is calculated to form an image in a 7 mm by 7 mm area. By scaling up or down the lens, the image field may be anywhere between 1×1 mm and 50×50 mm. For lower NA lenses, the image field size may be even greater. The refractive index of silica at 193 nm is 1.55077, and that index has been used in the calculations. Present designs are calculated at the normalizing wavelength of 0.193 nm. Should it be desirable to use this system at 157 nm or at any other wavelength down to 120 nm and up to the far infrared spectral region, only minute changes in design will be required. For instance, $CaF_2$ has an index of refraction of 1.5570 at 157 nm, which is very close the index of fused silica at 193 nm. Adjustments may be accomplished by some very slight changes to the curvatures of the elements. Similarly in the visible range, where the wavelength is much longer, the aberrations will decline further. In the visible region, most of the conventional glasses may be used. The change in wavelength does not change the transverse aberrations but the wavefront aberrations do increase in proportion to the inverse of the wavelength. Thus for diffraction limited performance, it is essential to use suitable criteria based on physical optics.

Figure 6:
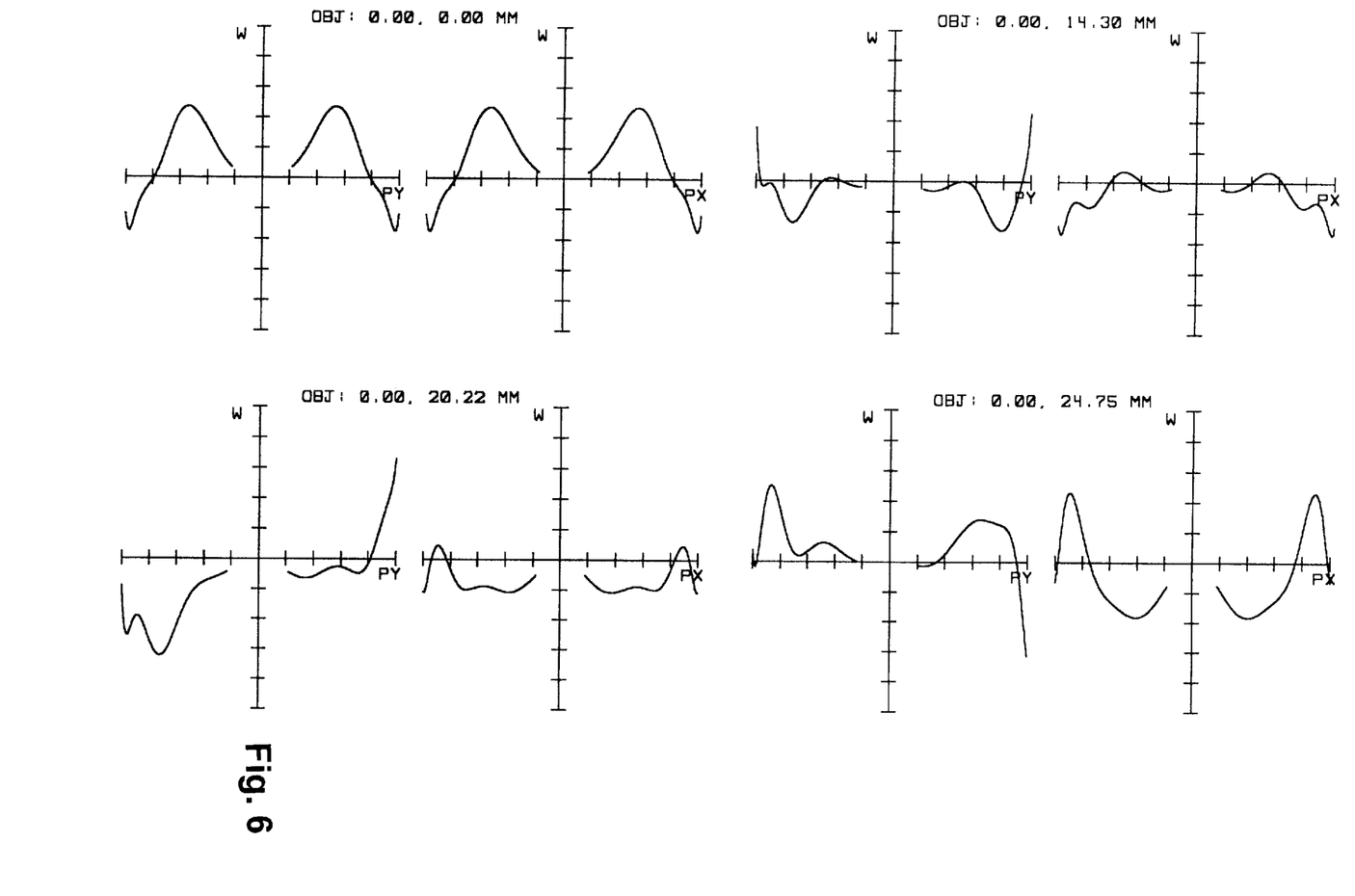
FIG. 6. Wavefront aberrations at 193 nm for the design of FIG. 5.

The attainable performance for the lens of FIG. 5 may be judged from FIG. 6, which shows the wavefront aberrations (optical path differences) at 193 nm for the design of FIG. 5. Full scale runs from −0.1 to +0.1 waves. It may be seen that only a negligible portion of the wavefront departs by more then 10 nm from a perfect sphere converging on the image plane. The Root Mean Square (RMS) value of the wavefront deformation over the field varies between 0.028 to 0.010 waves. The calculated Modulation Transfer Function (MTF) for the system and the diffraction limited MTF show that the state of correction is almost perfect. The lens cuts off at 7,170 lines/mm over the entire field. The lens altered for use at 157 nm and $CaF_2$ would be capable of printing lines of linewidth LW $LW = k_1 * Wavelength/NA = 0.4 * 157 \, nm/0.69 = 90 \, nm$ where $k_1$ is a proportionality constant of order 1, depending on the modulation required by a specific process.

The distortion of the lens of FIG. 5 is less than 0.002%. The lens is also almost telecentric on the object and image size. This means that the off axial bundles are leaving the object plane and impinging on the image plane almost at right angle.

As may be seen from the drawing of FIG. 5 and tabulated data of Table I and Table IA, some adjacent radii are very close in value. For less demanding applications the air spaces 31 and 19 may be eliminated or substituted by other degrees of freedom. Also some thicknesses may be thinned or thickened depending on the results required.

The system as described has a small central obstruction of less than 1/5 in linear terms. Due to this obstruction the MTF drops somewhat in the low frequency range and is higher in the higher frequency range. This phenomenon is well known to the astronomers. However for printing of fine lines, a small central obstruction may be somewhat beneficial, unlike in astronomy.

To keep the central obstruction within reasonable bounds a compromise must be established between the primary reduction, which is the ratio of the image size in the proximity of the turning mirror to the object size, and the inclination of the turning element, which bisects both optical axes. If this angle is too large the size of the turning element grows rapidly due to the divergence of the beams reflected from this element. For systems of low NA this is not a problem. In this design less then 4.0% of all rays are obstructed.

Another novel feature of the design, is the position of the aperture stop. In conventional optical systems there is a field lens in the intermediate image plane; without the field lens the position of the central obstruction wanders over the field. Also in conventional mirror systems the aperture stop is positioned on a reflecting surface in order to minimize its size. Here, to the contrary, the aperture stop is in front of the first reflecting element. Now the two focusing reflecting elements act as a "virtual field lens" imaging the aperture stop in the proximity of the turning element and thus minimizing the shift of the central obstruction over the field.

Figure 7:
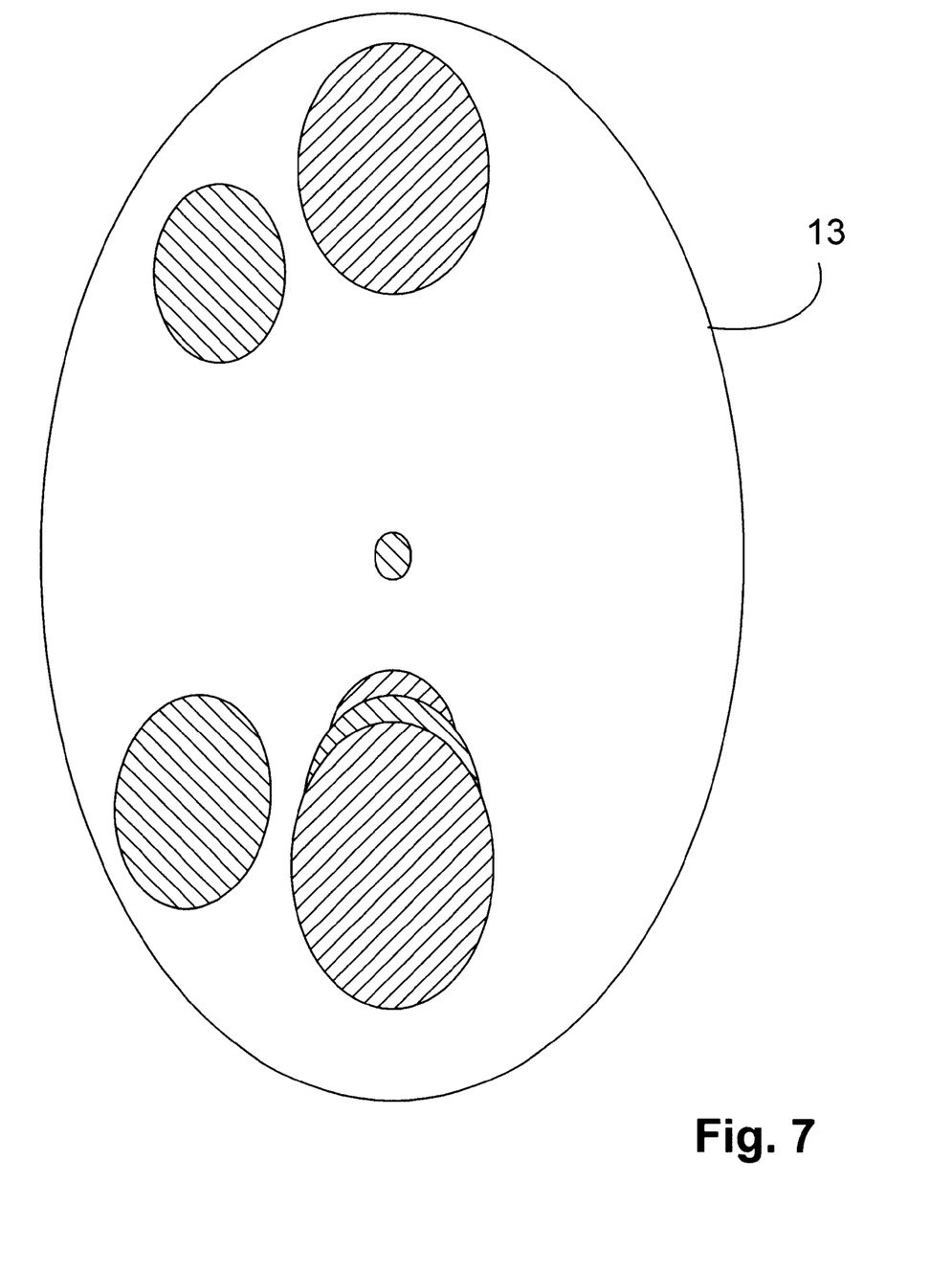
FIG. 7. Intersection of beam cones on the elliptical face of the turning mirror of FIG. 5.

Another aspect of minimizing the obstruction is the focusing of the axial bundle on the turning element. The best shape of the turning element is not an ellipse. A small improvement in the lens design can be gained by plotting the intersection of the beam cones on the elliptical face of the turning mirror 70 as done in FIG. 7 for rays from the center, from each corner, and from middle of each side of a 35 by 35 mm object (for example a lithographic mask). The central obstruction may then be reduced by trimming away that material not needed to reflect all the light. In some applications, it may be desirable to limit the central obstruction further or, as for instance in a scanning system with a rectangular field of view, trim away half of the turning mirror.

Table 1 and IA give the parameters of the various optical elements shown in FIG. 5 in a form recognizable to one of skill in the art of lens design who uses various lens design computer programs for ray tracing. The results of the lens calculations show that performance comparable to refractive lens design is possible using many fewer optical elements, and where the largest diameter optical elements are focusing mirrors.

Figure 8:
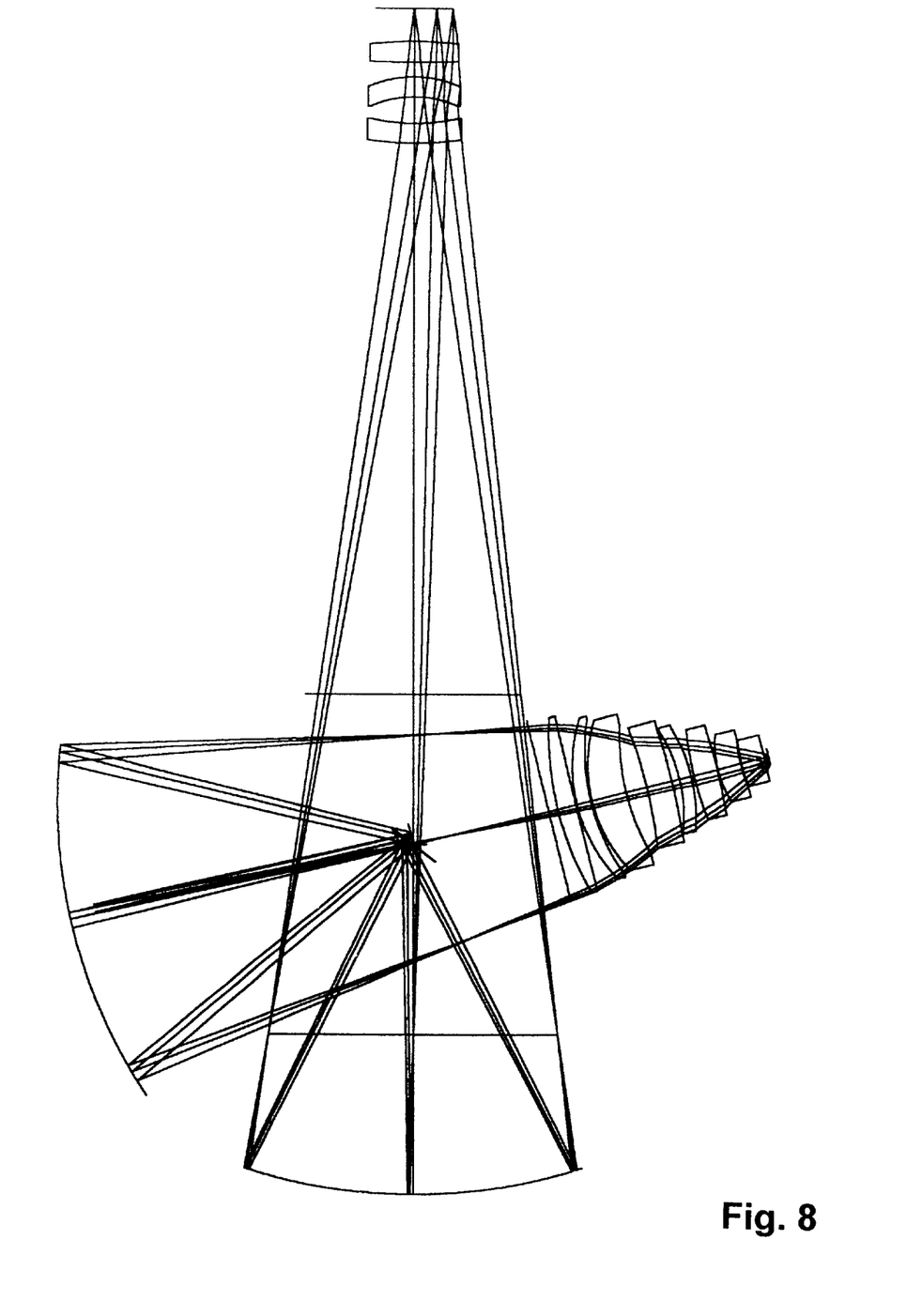
FIG. 8. Example of a partially optimized lens design of the apparatus of the invention.

FIG. 8 shows a second example of a partially optimized lens design using the principle of field curvature compensation and its application to flat field anastigmats.

Tables II and IIA give the parameters of the various optical elements shown in FIG. 8 in a form recognizable to one of skill in the art of lens design who uses various lens design computer programs for ray tracing.

The structure of FIG. 8 is substantially different from the previous example shown in FIG. 5. First, the Mangin is replaced by a mirror and another element is added close to the object plane. Also one element is removed from the proximity of the image plane. In addition, the structure of the refracting portion is quite different. It is possible to design therefore a set of lenses of similar performance having in common only the three reflecting elements and one or two groups of refracting elements. The system reduction is again 5× and the image forming NA is 0.67. The image field coverage is increased to 10 mm×10 mm. The lens of FIG. 8 has physical size is larger by some 30% than the lens of FIG. 5. The total number of refracting elements is the same. One element is added to the object lens group and one element is removed from the image forming group. Also one aspheric is added on a negative surface. The lens data are again calculated for 193 nm and the refractive index of silica.

Figure 9:
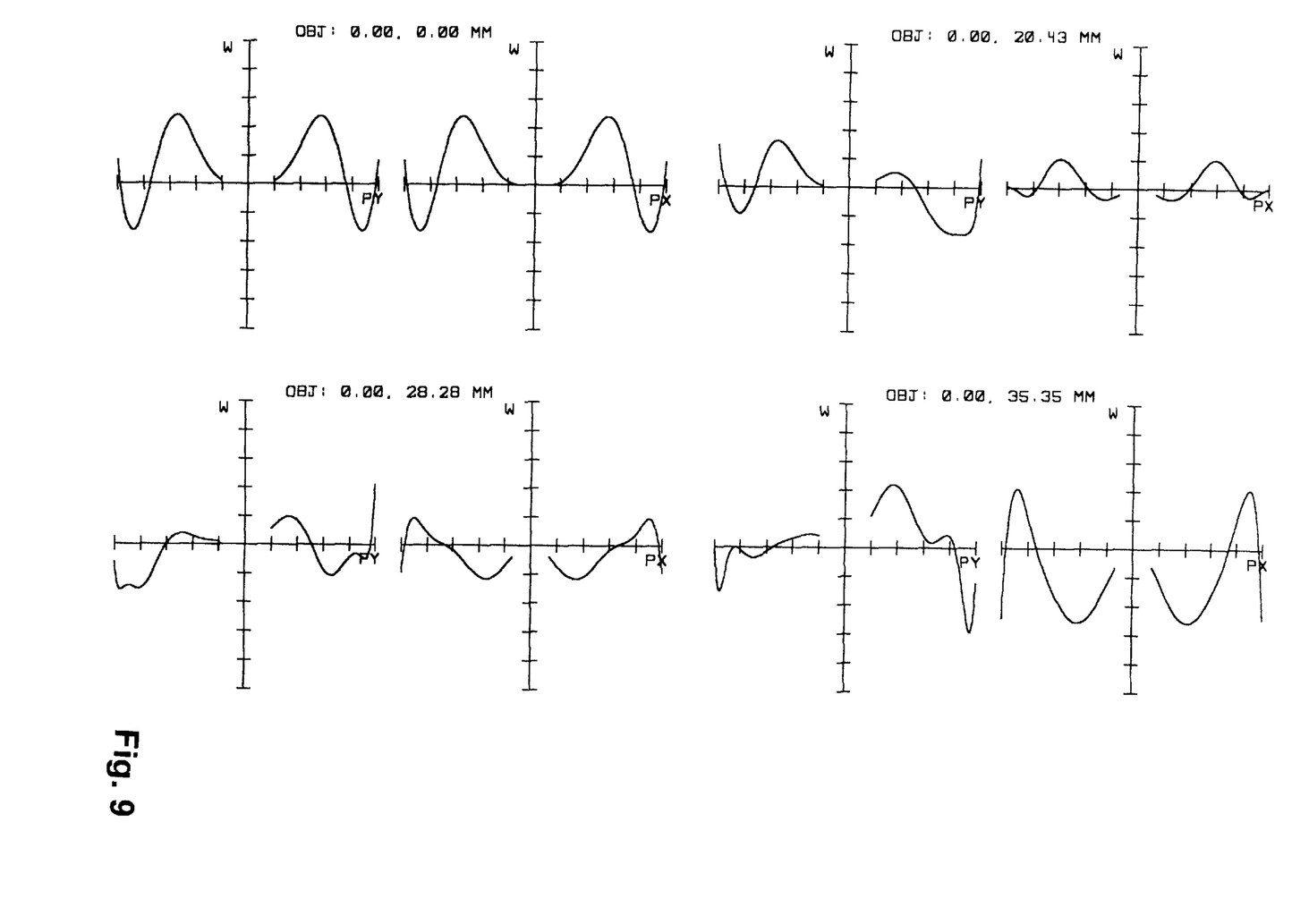
FIG. 9. Wavefront aberrations at 193 nm for the design of FIG. 8.

FIG. 9 shows the wavefront aberrations (optical path differences) for the design of FIG. 8 with full scale −0.1 to +0.1 waves at 193 nm. It may be seen that only a negligible portion of the wavefront departs by more then 10 nm from a perfect sphere converging on the image plane.

The RMS wavefront error as a function of the field. In the mid-field it is below $1/100$ of a wavelength. The wave aberrations are below $1/20$ of a wave and therefore the lens may be also used at 157 nm. The MTF is also excellent and the distortion is less than $1/3$ of the first design. The other properties are similar to the design in FIG. 5.

The design of FIG. 8 may be used to explain the performance of the system and why so few optical elements are required to obtain it. The field curvature contributed by the two aspheric mirrors is −242.66 waves. The refracting elements have a contribution of +241.58 waves giving a total of −1.08 waves of Petzval sum or field curvature for compensation of higher order curvatures. In other words, the contraction and expansion of the rays needed to accomplish the correction is now due to the rays coming to focus between the two reflecting elements. Using refractive elements for this purpose would make the field curvature worse.

This new family of designs has a fundamental advantage in limiting the size of the refracting elements. It should be noted that since the number of these surfaces is smaller the geometrical accuracy of these surfaces may be somewhat lower than in traditional step-and-repeat lens and hence each lens element will be cheaper to produce than the lens elements of the traditional lenses. The aspherics, if any, can be placed on concave surfaces and thus are easier to measure correctly. Furthermore, the rotational symmetry of the system makes assembly and testing easier unlike in the case of ring systems. The only negative attribute of the present invention is that the smaller elements of larger bending power have tighter centering and spacing requirements than the requirements of conventional lenses. These tighter requirements are the direct outcome of the small number of refracting elements used in the present invention.

While both of the designs described above pertain to monochromatic applications, the basic structure is equally suitable for use in microscopy, photography, and in other uses where color correction is essential. In these situations, the refractive portions of the system may be achromatized separately or in combination with Mangin mirrors.

Obviously, many modifications and variations of the present invention are possible in light of the above teachings. It is therefore to be understood that, within the scope of the appended claims, the invention may be practiced otherwise than as specifically described.

I claim:

1. An apparatus for imaging light from an extended object on to an image receiver located at a finite distance from the extended object, comprising:

a base;

a first focusing reflective element the first focusing reflective element attached to the base, the first focusing reflective element having a first optical axis, the first focusing reflective element receiving a diverging beam of light from the object;

a second focusing reflective element, the second focusing reflective element attached to the base the second focusing reflective element having a second optical axis, wherein the first and the second optical axis are substantially coplanar;

a first turning mirror attached to the base, where the first turning mirror is located approximately at the intersection of the first and the second optical axis, and where the normal to the surface of the first turning mirror at the intersection bisects the angle between the first and second optical axis, and where the first turning mirror has a small area compared to areas of the first and second focusing reflective elements;

at least one refractive element attached to the base, the refractive element contributing to the optical correction required to correct the imaging of the extended object on to the image receiver;

wherein:

light emitted from the extended object is transmitted as the diverging beam of light to the first focusing reflective element in the general direction of the first optical axis; and wherein the diverging light beam is reflected from the first reflective element as a converging beam to the first turning mirror, and wherein the light is further reflected from the first turning mirror as a diverging beam to the second reflective element, and wherein the light reflected from the first turning mirror is reflected in turn from the second reflective element and transmitted in the general direction of the second optical axis to the image receiver, and wherein the light passes through the at least one refractive element located in least one position chosen from the group of positions consisting of a position between the extended object and the first focusing reflective element and a position between the second focusing reflective element and the image receiver, and wherein an image of the extended object is formed on the surface of the image receiver.

2. The apparatus of claim 1, wherein at least one of the first and second focusing reflective elements are concave mirrors.

3. The apparatus of claim 2, wherein the radius of curvature of the at least one concave mirror is less than three times the square root of the area of the at least one concave mirror.

4. The apparatus of claim 1, wherein at least one of the first and second focusing reflective elements are Mangin elements.

5. The apparatus of claim 1, wherein the first and second focusing reflective elements have approximately equal areas.

6. The apparatus of claim 5, wherein the first and second focusing reflective elements have a focal length less than 1.5 times the square root of the area the first and second focusing reflective elements.

7. The apparatus of claim 5, wherein the first and second focusing reflective elements have a focal length less than 1.25 times the square root of the area of the first and second focusing reflective elements.

8. The apparatus of claim 1, wherein the at least one refractive element is made of material substantially transparent to light of wavelength 190 nm.

9. The apparatus of claim 8, wherein the at least one refractive element is made of material substantially transparent to light of wavelength 157 nm.

10. The apparatus of claim 1, further comprising a second turning mirror located between the extended object and the first reflective focusing element, wherein light transmitted from the extended object in a direction parallel to the second optical axis is reflected to be parallel to the first optical axis.

11. The apparatus of claim 1, further comprising:

a first flat turning mirror located between the extended object and the first reflective focusing element, operative so that light transmitted from the extended object along a first line is turned along the first optical axis, wherein the first line is normal to a surface of the extended object and intersects the surface of the extended object in the center of the surface; and a second flat turning mirror located between the second reflective focusing element and the image receiver, operative so that light transmitted from the second reflective focusing element along the second optical axis is turned along the first line to impinge normally on a surface of the image receiver in the center of the surface of the image receiver.

12. The apparatus of claim 1, wherein the object is a transmission mask, and the image receiver is a photoresist covered semiconductor wafer.

13. A photolithographic system for imaging a mask on to a photoresist covered semiconductor, comprising:

a base;

a light source fixed with respect to the base, the light source for illuminating a mask removably attached to the base;

a first focusing reflective element, the first focusing reflective element attached to the base, the first focusing reflective element having a first optical axis;

a second focusing reflective element, the second focusing reflective element attached to the base, the second focusing reflective element having a second optical axis, wherein the first and the second optical axis are substantially coplanar;

a turning mirror attached to the base, where the turning mirror is located approximately at the intersection of the first and the second optical axis, and where the normal to the surface of the turning mirror at the approximate intersection bisects the angle between the first and second optical axis, and where the turning mirror has a small area compared to areas of the first and second focusing reflective elements;

at least one refractive element attached to the base, the refractive element contributing to the optical correction required to correct the imaging of the mask on to a photoresist covered semiconductor;

a wafer holder attached to the base for holding the photoresist covered semiconductor; and a mask aligner for aligning the mask and the photoresist covered semiconductor with respect to each other;

wherein:

light emitted from the mask is transmitted to the first focusing reflective element in the general direction of the first optical axis; and wherein the light is reflected from the first focusing reflective element to the turning mirror, and wherein the light is further reflected from turning mirror to the second focusing reflective element, and wherein the light reflected from the turning mirror is reflected in turn from the second focusing reflective element and transmitted in the general direction of the second optical axis to the photoresist covered semiconductor, and wherein the light passes through the at least one refractive element located in least one position chosen from the group of positions consisting of a position between the extended object and the first focusing reflective element and a position between the second focusing reflective element and the photoresist covered semiconductor, and wherein an image of the extended object is formed on the surface of the photoresist covered semiconductor.

14. The system of claim 13, further comprising a computer for controlling the system.

15. The system of claim 14, further comprising a computer program for controlling computer.

16. An apparatus for imaging light from an extended object on to an image receiver located at a finite distance from the extended object, comprising:
   a base;
   a first focusing reflective element, the first focusing reflective element attached to the base, the first focusing reflective element having a first optical axis, the first focusing reflective element receiving a diverging beam of light from the object;
   a second focusing reflective element, the second focusing reflective element attached to the base, the second focusing reflective element having a second optical axis, wherein the radius of curvature of at least one of the focusing reflective elements is less than three times the square root of its area;
   a first turning mirror attached to the base, where the first optical axis and the second optical axis each intersect the reflecting surface of the first turning mirror, and where the first turning mirror has a small area compared to areas of the first and second focusing reflective elements;
   at least one refractive element attached to the base, the refractive element contributing to the optical correction required to correct the imaging of the extended object on to the image receiver;
   wherein:
      light emitted from the extended object is transmitted as the diverging beam of light to the first focusing reflective element in the general direction of the first optical axis; and wherein the diverging light beam is reflected from the first reflective element as a converging beam towards the first turning mirror, and wherein the light is further reflected from the first turning mirror and travels as a diverging beam to the second reflective element, and wherein the light reflected from the first turning mirror is reflected in turn from the second reflective element and transmitted as a converging beam in the general direction of the second optical axis to the image receiver, and wherein the light passes through the at least one refractive element located in least one position chosen from the group of positions consisting of a position between the extended object and the first focusing reflective element and a position between the second focusing reflective element and the image receiver, and wherein an image of the extended object is formed on the surface of the image receiver.

* * * * *